US006920525B2

(12) United States Patent
Chadwick et al.

(10) Patent No.: US 6,920,525 B2
(45) Date of Patent: Jul. 19, 2005

(54) METHOD AND APPARATUS OF LOCAL WORD-LINE REDUNDANCY IN CAM

(75) Inventors: Thomas B. Chadwick, Essex Junction, VT (US); Tarl S. Gordon, Leander, TX (US); Rahul K. Nadkarni, Colchester, VT (US); Michael R. Ouellette, Westford, VT (US); Jeremy Rowland, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 369 days.

(21) Appl. No.: 10/199,788

(22) Filed: Jul. 19, 2002

(65) Prior Publication Data

US 2004/0015651 A1 Jan. 22, 2004

(51) Int. Cl.[7] .............................................. G06F 12/00
(52) U.S. Cl. ..................... 711/108; 714/711; 714/718; 365/49; 365/52; 365/200; 365/230.06; 711/108
(58) Field of Search .......................... 711/108; 714/711, 714/718; 365/49, 200, 230.06, 52

(56) References Cited

U.S. PATENT DOCUMENTS

| 6,137,707 A | * | 10/2000 | Srinivasan et al. | ........... 365/49 |
| 6,275,406 B1 | * | 8/2001 | Gibson et al. | ................ 365/49 |
| 6,286,116 B1 | * | 9/2001 | Bhavsar | ...................... 714/720 |
| 6,728,123 B2 | * | 4/2004 | Batson et al. | ................. 365/49 |

* cited by examiner

*Primary Examiner*—Mano Padmanabhan
*Assistant Examiner*—Mehdi Namazi
(74) *Attorney, Agent, or Firm*—Whitham, Curtis & Christofferson, P.C.; Robert A. Walsh

(57) ABSTRACT

A local word-line redundancy architecture and method that implements both word-line and match-line steering for semiconductor memories and more particularly for content-addressable memories (CAM) are introduced. According to the present invention, the method of performing local word-line redundancy comprising: testing by using BIST, storing results, comparing failing read address data and failing match-line address data to determine if redundancy is possible and, if so, storing the redundancy repair data pattern and loading that patten upon initialization so that redundancy steering is activated.

11 Claims, 9 Drawing Sheets

METHOD AND APPARATUS OF LOCAL WORD-LINE REDUNDANCY IN CAM

BACKGROUND OF THE INVENTION

1. Field of the Invention

The present invention relates to the semiconductor computer memories, and more particularly to a technique for local word-line redundancy that incorporates both word and match-line steering in content-addressable memories (CAM)

2. Background Description

In recent years the level of integration of a semiconductor memory has been increased greatly. However, as the level of integration of a semiconductor memory is made larger, each element is decreased in size, and/or the semiconductor chip is increased in area. Either can aggravate a problem that the manufacturing yields of the memory become correspondingly reduced. In order to reduce effects of this problem, the so-called redundancy technique is used, in which defective memory cells are replaced by spare memory cells already provided on a chip.

Associative memories or content-addressable memories (CAM) retrieve information on the basis of data content rather than addresses. A CAM is adapted to perform fast searches of list based data stored in plurality of locations called CAM entries. Each CAM entry stores a word of data in a plurality of CAM cells, and includes circuits to perform comparisons with externally asserted comparand word typically stored in a comparand buffer. The explosive growth in the communications industry is driving the need for larger CAM circuits. As the area and/or number of devices of the CAM increases, the probability of a process defect occurring in the CAM circuits increases. To alleviate this problem and to improve the manufacturing yields, it becomes important to provide redundancy in CAM circuits.

CAM designs present a unique problem when considering word-line redundancy in that CAM entries are both written and read as well as used for matching, therefore one cannot simply exchange or replace a bad entry with a redundant entry with decoder steering alone. There are known techniques that provide word-redundancy for CAMs. One method uses a separate redundant array architecture for providing address translation, so that the redundant entries are represented as the correct entry index that they are replacing. This technique is the subject matter of concurrently filed application FIS9-20011-0213 US1.

A second approach uses priority encoder to implement word-line redundancy. This technique limits test capability by potentially missing faults. For example, with a priority encoder which gives priority to higher addresses, the most significant failing address can mask other failing addresses. A disadvantage of this technique is increasing of the test time since each match-line is compared to an expected value during test.

Built-in self-test (BIST) is used for testing of memory for existing errors. In general, BIST is special technique in which an external test resource is not needed to apply test patterns for checking a circuit's response to those patterns. BIST also has ability to capture the test results without the need for an external tester. This is often achieved by using a multi-input signature register to capture individual test results and compress these into an overall value called the test signature.

SUMMARY OF THE INVENTION

The claimed invention is intended to improve fault tolerance of semiconductor memories and reduce the test time. The technique is related to the passive approach of hardware redundancy, which employs the concept of fault masking to hide the occurrence of faults and preventing the fault from resulting in errors. In the present method failing word-lines and match-lines are masked and replaced by utilizing redundant entries in the memory array by steering the word-line decoder outputs and the match-line outputs around the failing word-lines and match-lines. The proposed method implements word-line redundancy that incorporates word-line and match-line steering and involves using BIST (built-in self-test).

In the present invention during read/write BIST testing, failing read address data is stored in a register. The match-line operations are then tested with a test result stored in the match-line latches for comparison. The system can determine if a match-line fail has occurred. This data is stored and can be accessed using only one shift operation which is done just before the end of BIST testing in order to capture the match-line fail address in a register. This technique is much more efficient than scanning fail data after each test pattern compare, and improves fault tolerance performance for content-addressable memories.

BRIEF DESCRIPTION OF THE DRAWINGS

The foregoing and other objects, aspects and advantages of an exemplary embodiment of the invention will next be described in greater detail, with the aid of drawings. Shown are.

DETAILED DESCRIPTION OF A PREFERRED EMBODIMENT OF THE INVENTION

Figure 1:
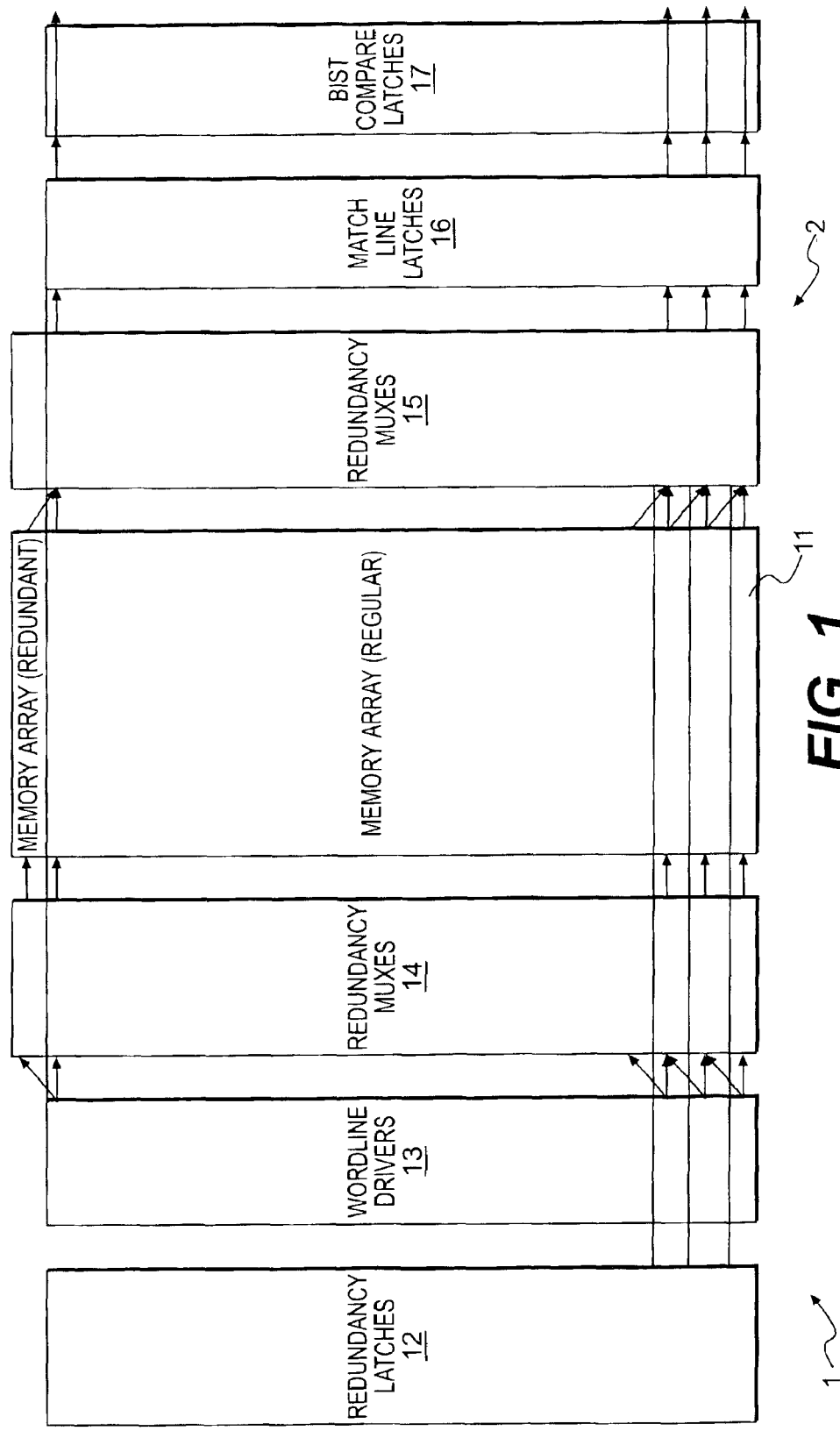
FIG. 1 shows a high level system in whole.

Now, an embodiment of the present invention will be explained below, with reference to the drawings. FIG. 1 illustrates the high level system implementation of the invention. On the left side (1) of the memory array 11, redundancy latches 12 are used to gate the selection of redundant word-line(s) and mask failing word-line(s). Failing word-line(s) are replaced by utilizing redundant word-lines in the memory array 11 by steering the word-line decoder output(s) associated with the failing word-line(s) and all subsequent word-line decoder outputs around the failing word-line(s). This technique essentially switches a failing word-line or block of failing word-lines out of the memory array 11 and replaces them with redundant word-lines in the array by utilizing this steering technique. Word-line drivers 13 provide decode and drive functions for each selected word-line. Redundancy MUXs 14 are used to perform the redundant word-line switching function. On the right side (2) of the memory array 11, redundancy MUXs 15 are controlled by the outputs of the redundancy latches 12 on the left side and perform the match-line steering function. Match-line steering is done to complement the steering of redundant word-line(s). Without match-line steering, word-line and match-line outputs would not coincide. The MUXs 15 feed match-line latches 16, which in turn feed the BIST compare structure 17, which in turn feeds fail-capture sticky latches 35 that are used during BIST testing to capture failing match-line signature and shown in FIG. 3.

Figure 2:
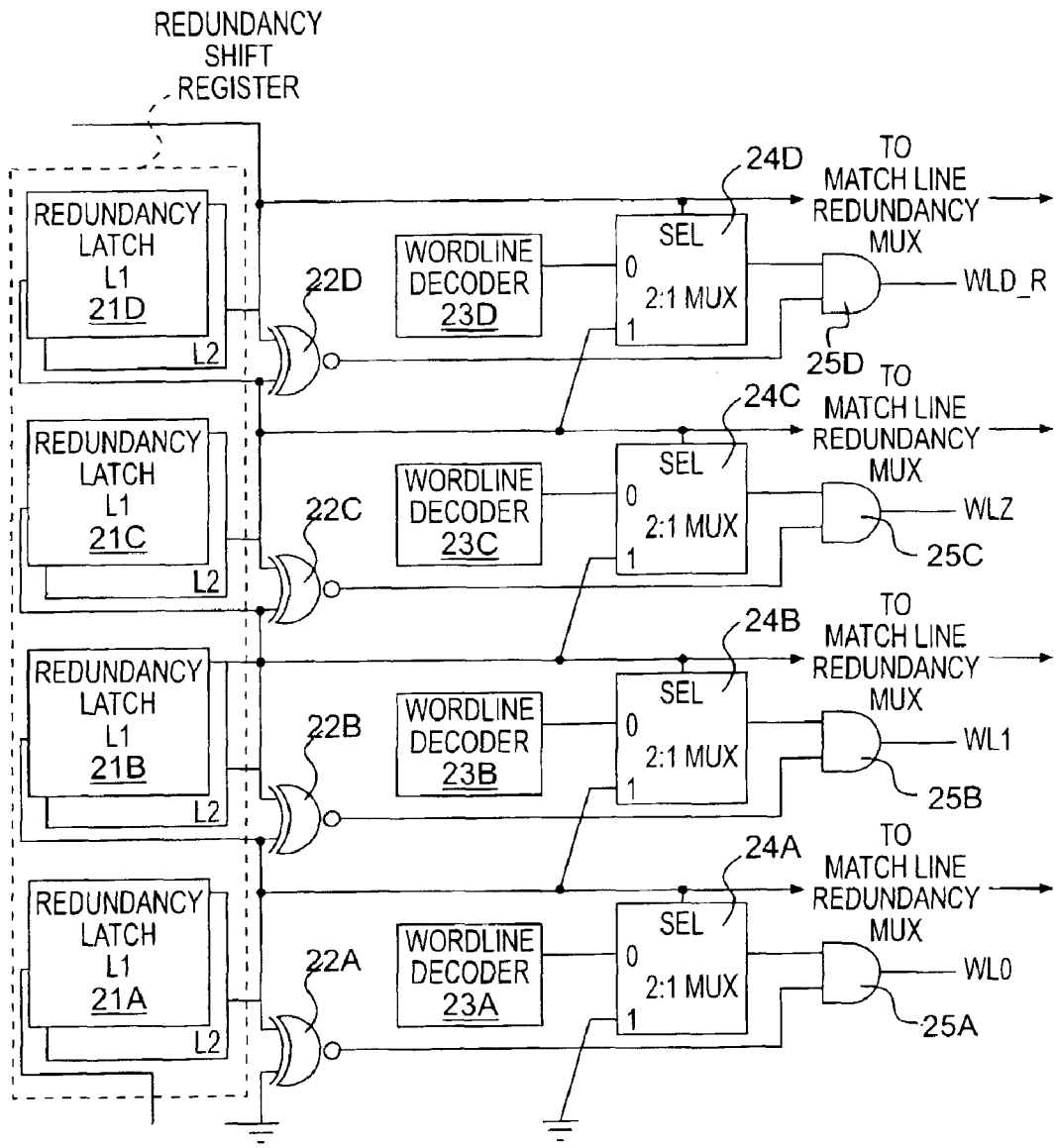
FIG. 2 shows the details of the word-line circuitry on the left side of the memory array in FIG. 1.

FIG. 2 shows details of the word-line circuitry 1 of the memory array in FIG. 1. Redundancy latches 21 feed XNOR gates 22, MUXs 24 and 31. These latches contain redundancy data that was loaded as a result of BIST testing. BIST testing details will be discussed later. For example, if the second word-line WL1 tested faulty, the redundancy latches 21A, 21B, 21C and 21D would be loaded with 0111 pattern respectively. The logic 0 loaded in the first latch 21A causes the MUX 24A to select the output of word-line decoder 23A. The XNOR circuit 22A outputs a logic 1, which enables WL0. The second redundancy latch 21B (state=logic 1) is set to indicate a failing word-line. The logic 1 output of the second redundancy latch 21B coupled with a logic 0 from the first redundancy latch 21A results in a logic 0 output from the second XNOR circuit 22B. This output drives the second AND logic 25B to output a logic 0 thereby blocking the output of the second word-line decoder 23B from driving the failing word-line WL1. The third redundancy latch 21C and all subsequent latches store a logic 1. Setting these subsequent redundancy latches to logic 1 enables the steering of subsequent word-line decoder 23 outputs around the failing word-line WL1 by shifting the word-line decoder 23B feeding the failing word-line WL1 and all subsequent decoder outputs to the next adjacent word-line in the memory array. In addition, the XNOR circuitry coupled with the AND logic provides a means for disabling the failing word-line while enabling subsequent steering word-lines. The net result is that word-line WL1 of the memory array is disabled and all word-line decoders 23 after decoder 23A are steered to the next adjacent word-line in the array.

Figure 3:
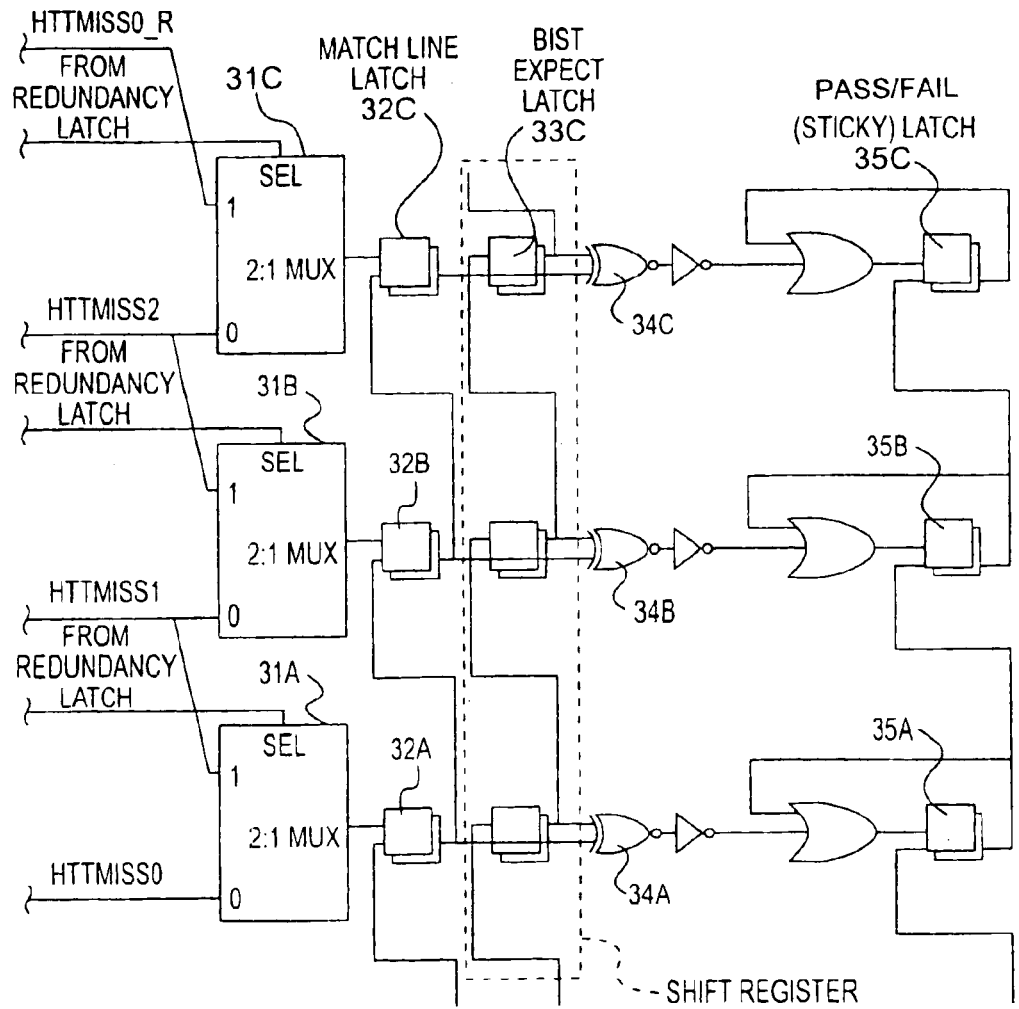
FIG. 3 demonstrates the details of the match-line circuitry on the right side of the memory array in FIG. 1.

Exemplary details of the match-line circuitry 2 of the memory array in FIG. 1 are shown in FIG. 3. Since match-lines are coincident with word-lines, there is no need for redundant match-lines. Therefore, the match-line outputs must be steered as well, in order to account for word-line shifting or steering. Without match-line steering, match-line n would not be coincident with word-line n when redundancy is implemented. Redundancy MUXs 31 are again used to perform steering function. As previously stated, these MUXs 31 (and 71 in FIG. 7) receive their select input from the redundancy latches. The MUXs feed match-line latches 32 (and 52 and 72 in FIGS. 5 and 7, respectively) which in turn feed the BIST compare structure 34. The BIST compare latches 33 (and 53 and 73 in FIGS. 5 and 7, respectively) are used to load test 'expect match/mismatch' data for comparing against match-line test results. The BIST compare latches 33 feed XNOR circuitry 34 which compares the match-line outputs to the test 'expect match/mismatch' data. This logic provides a means for identifying failing match-lines. These results are captured in failing match-line "sticky" latches 35 (and 54 and 74 in FIGS. 5 and 7, respectively) which are used in conjunction with read word-line stored address data in the BIST logic design to determine if repair using redundancy is possible, and if so, what to replace. BIST testing details will be discussed later.

Continuing with the previous example, the three match-line redundancy MUXs 31A, 31B, 31C would be loaded for example with a "011" pattern respectively corresponding to the "0111" redundancy pattern stored in the redundancy latches. This pattern sets match-line 0 equal to row 0. It sets match-line 1 equal to row 2(which is physically the third row in the memory array, but after shifting, it logically corresponds to the second word-line decoder 23B in FIG. 2). Finally, match-line 2 is set equal to row 3, which corresponds logically to word-line decoder 23C in FIG. 2. The net result is that by using match-line steering, match-lines will correspond to the correct word-line decoders.

Figure 4:
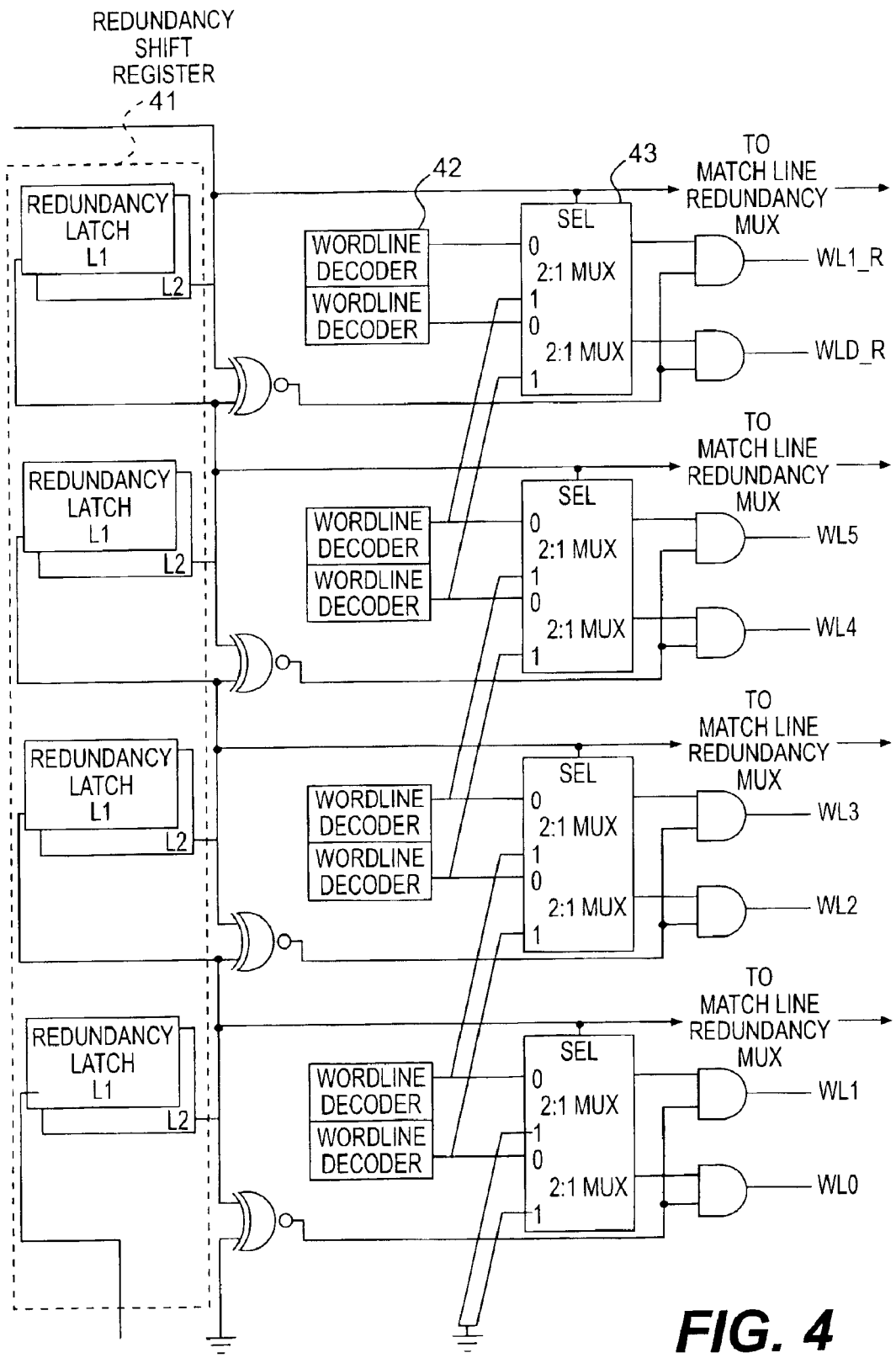
FIG. 4 shows second embodiment of the method on the word-line side.
Figure 5:
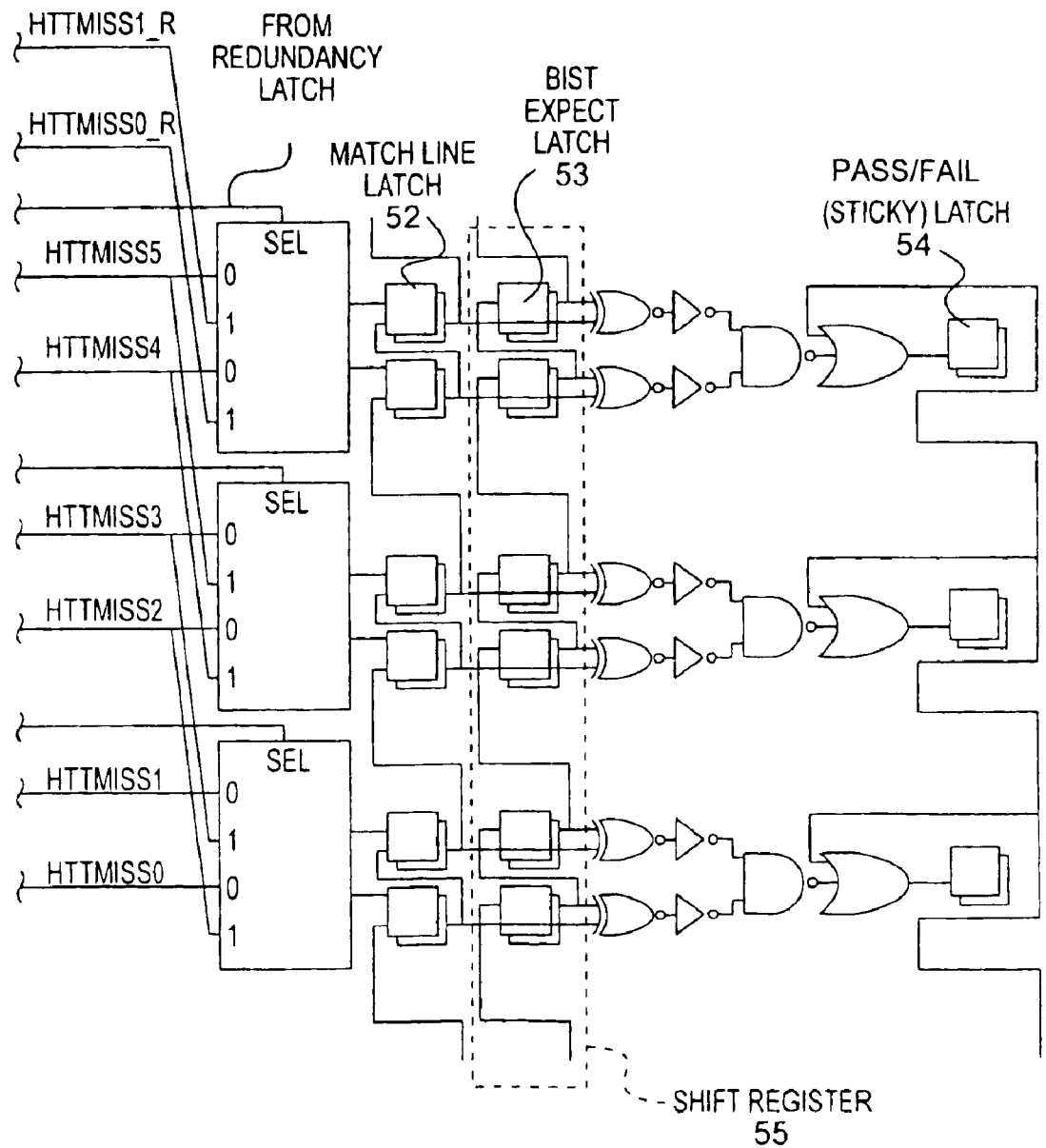
FIG. 5 shows second embodiment of the method on the match-line side.

This architecture can be extended in various ways so that a block of n word-lines can be replaced by a block of n redundant word-lines with a replacement selection granularity of m largely corresponding to the architecture illustrated in FIGS. 4 and 5 as will be understood by those skilled in the art. Such an implementation allows block of word-lines to be replaced instead by a single word-line as previously described.

Another embodiment of this architecture is illustrated in FIG. 4 and FIG. 5, where FIG. 4 shows the word-line decoder side (1) and FIG. 5 the match-line side (2) of FIG. 1. Here two word-lines are replaced (n=2) with a granularity of 2 (m=2). This means that either word-line group WL0 and WL1 or word-line group WL2 and WL3 or word-line group WL4 and WL5, etc., can be replaced. This technique employs one redundancy latch 41, one XNOR circuit 42, and one pass/fail "sticky" latch 54 for every two word-lines and match-lines. The redundancy latches and the XNOR circuits control the steering of the word-lines and the match-lines as described previously.

Figure 6:
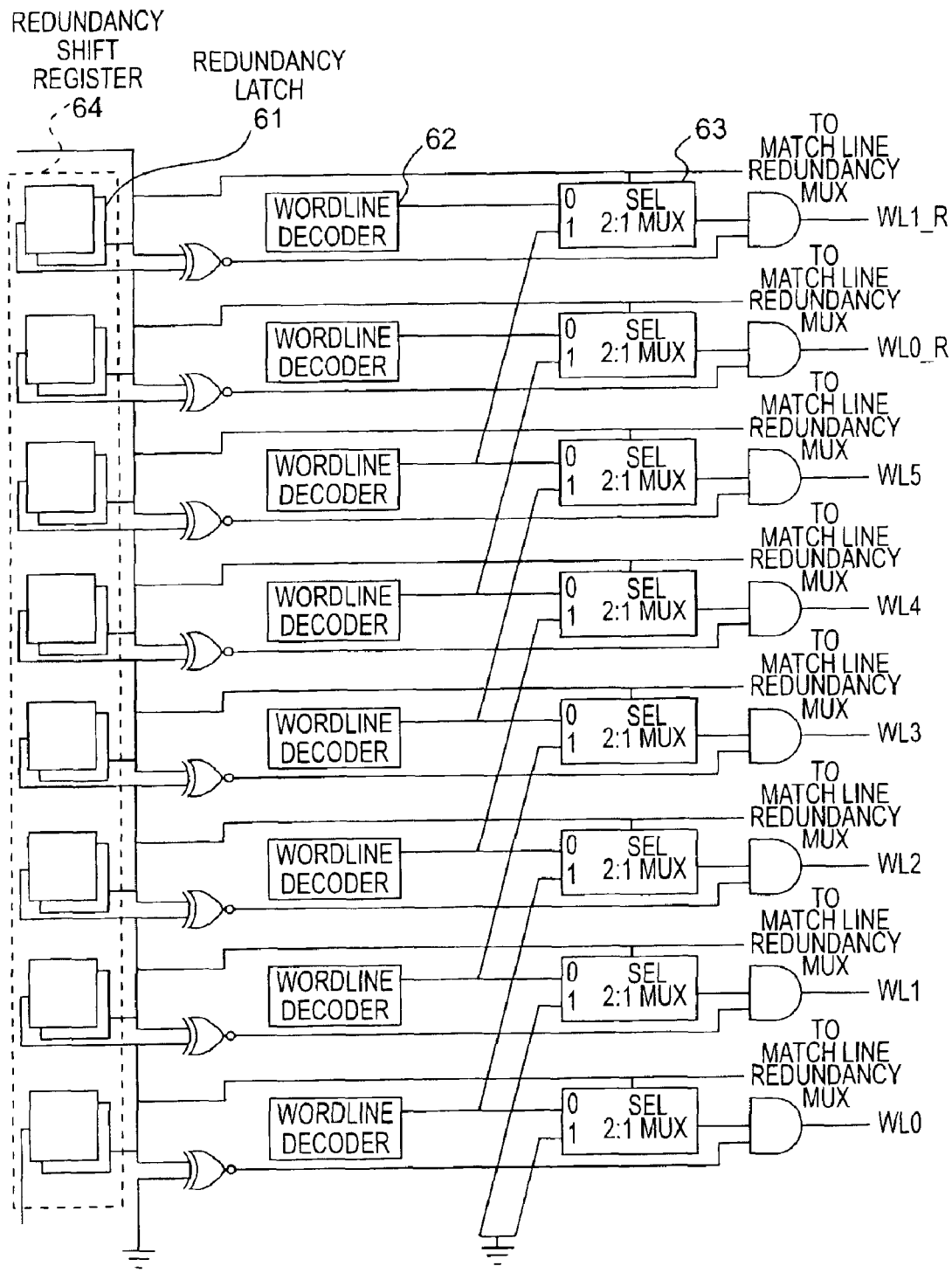
FIG. 6 illustrates third embodiment on the word-line decoder side.
Figure 7:
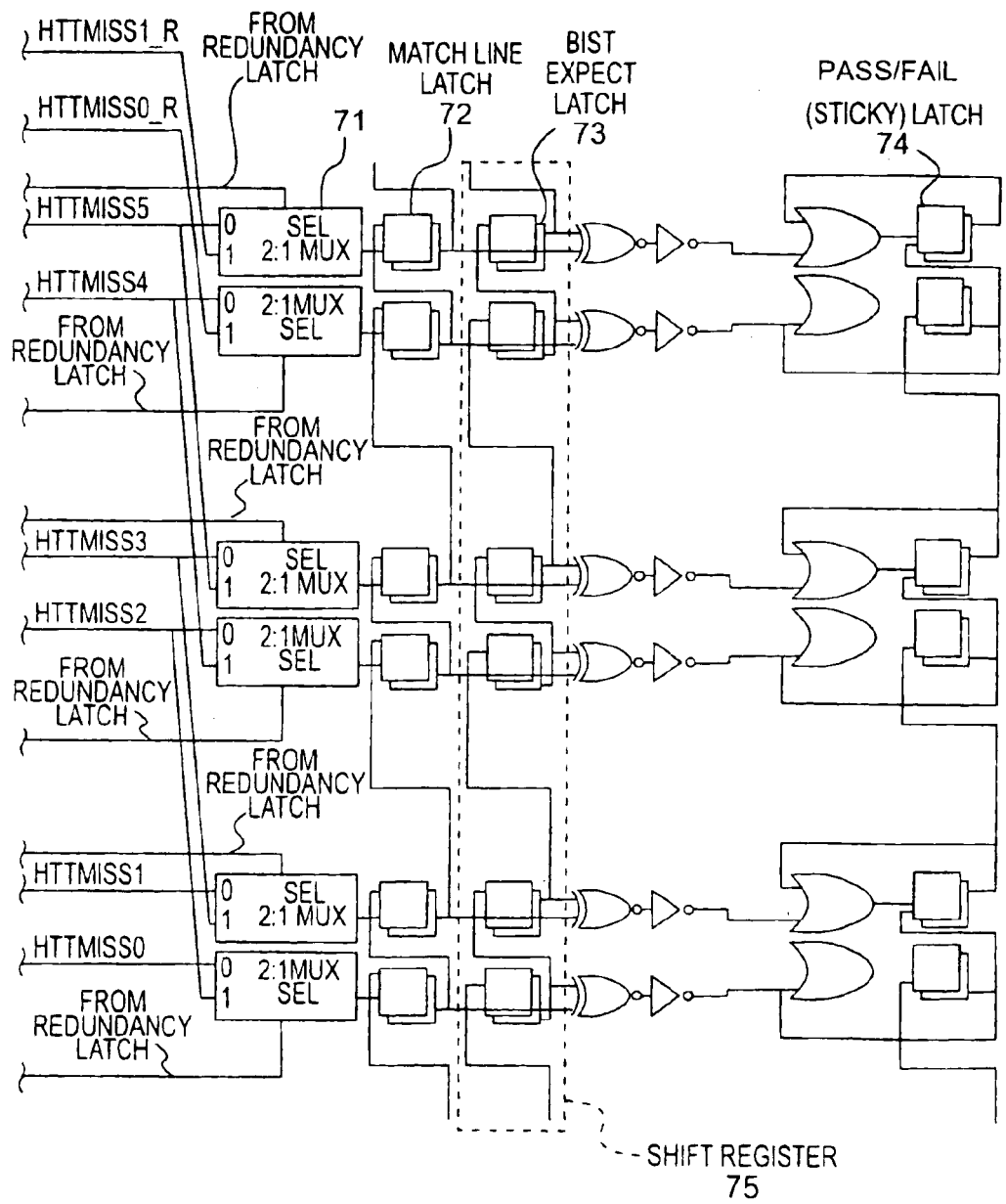
FIG. 7 shows third embodiment on the match-line side.

Another embodiment is illustrated in FIGS. 6 and 7. FIG. 6 shows the word-line decoder side and FIG. 7 match-line side. This embodiment enables two word-lines (n=2) to be replaced with a granularity of 1 (m=1). This means that either word-line group WL0 and WL1 or word-line group WL1 and WL2 or word-line group WL2 and WL3, etc., can be replaced. This allows for ease of boundary crossing (for example, if word-lines or match-lines WL1 and WL2 were faulty, this embodiment would allow word-lines WL1 and WL2 to be replaced where as the previous example could replace only word-line group WL0 and WL1 or word-line group WL2 and WL3). This technique also provides for substitution of lines at other spacing.

Figure 8:
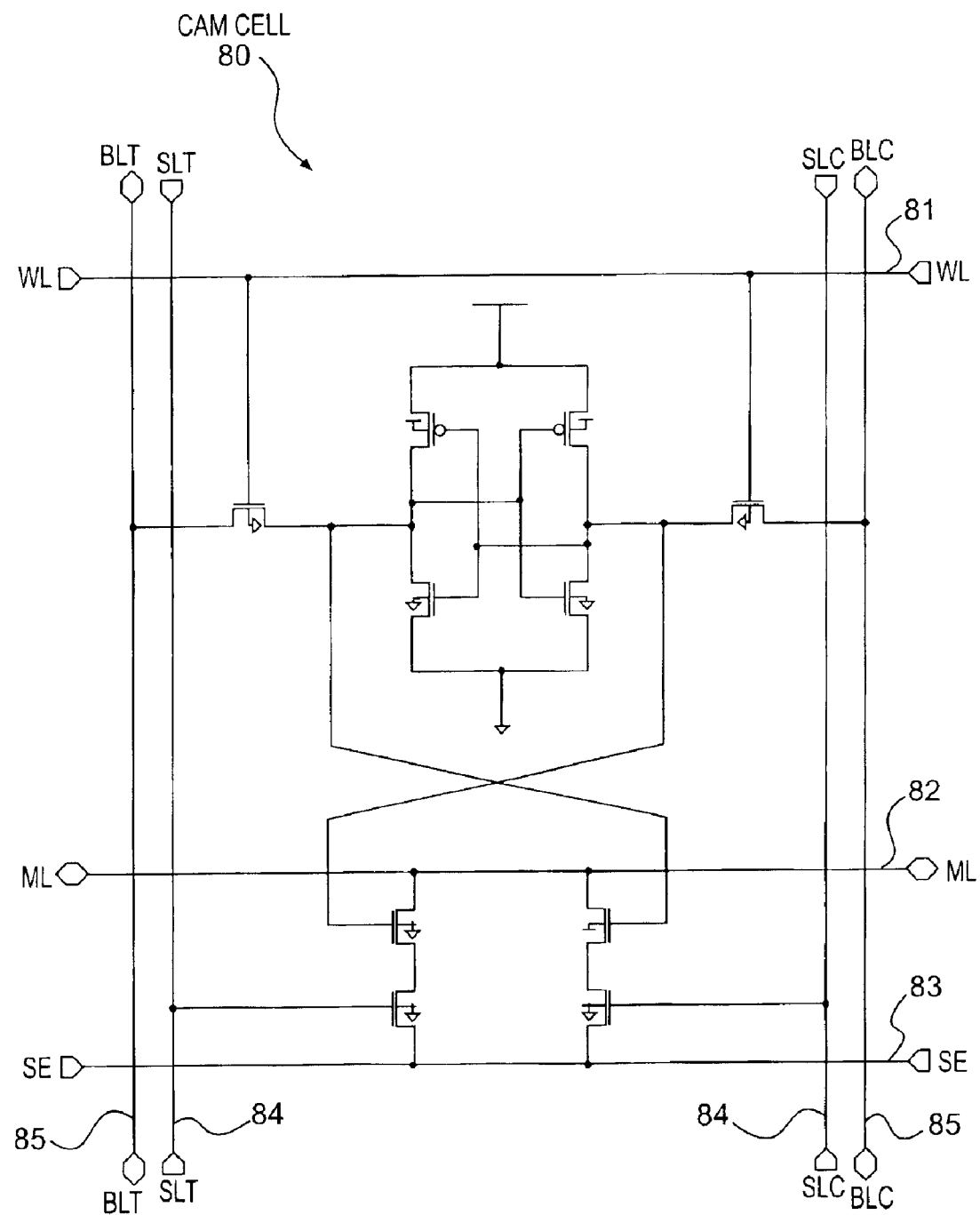
FIG. 8 shows the internal structure of a CAM array cell.

The FIG. 8 depicts a CAM cell 80 of related art that can be joined, through the Word Line (WL) 81, Match Line (ML) 82 and the Search Enable (SE) line 83, to a plurality of other identical CAM cells to form a CAM entry of related art. A plurality of such CAM entries are joined through the plurality of Bit Lines (e.g., BLT and BLC) 85 and Search Lines (e.g., SLT and SLC) 84 to form a CAM array. The search operation of the CAM cell can be selectively enabled, by asserting a logic Low voltage level, or disabled, by asserting a logic High voltage level, at the search enable line (SE) 83. The Match Line Pass-Gate of a CAM entry is a distributed pass-gate comprised of a plurality of parallel pass-transistors that are controlled by comparand bits asserted on the Search Lines (e.g., SLT and SLC) 84 and the logic state of the data storage cell(s) of each of the plurality of CAM cells. In case of a MATCH-ing entry, the Match-Line Pass-Gate of the MATCH-ing entry will remain OFF. Therefore the pre-charged match-line segment of a MATCH-ing entry will remain High after the search enabling line (SE) 83 is enabled (when SE 83 is driven to the Low voltage level). Conversely, the pre-charged match line segment of a MISS-ing subentry will drop Low after the search-enabling line (SE) 83 is enabled.

Figure 9:
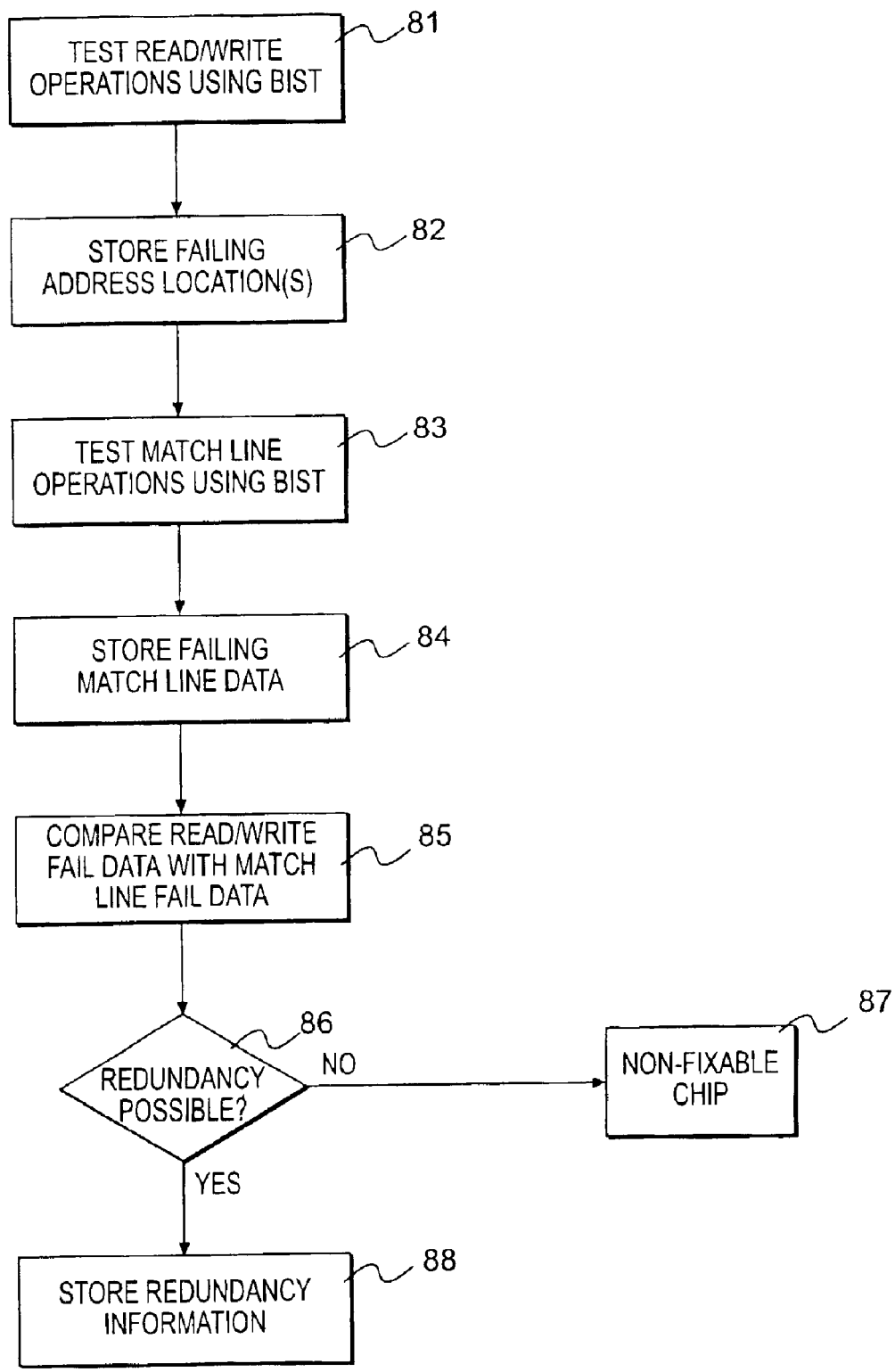
FIG. 9 illustrates a flow-chart diagram of using the method with BIST.

As illustrated in FIG. 9, a method of implementing word-line redundancy involves using BIST 91, 93 to test both read/write and match-line operations, record failing read addresses 92, compress the failing match-line values into failing match-line addresses 94, compare the failing read/write fail addresses with the match-line fail addresses 95, determine if repair with redundancy is possible 96 and, if so, use the failing read/write and/or failing match-line address data to blow fuses 98. The fuse data can then be accessed before functional operation, to load redundancy information into the redundancy latches for steering.

When testing both the read/write and match-line operations of the memory array, standard BIST techniques are used. These techniques are well known in the art and therefore will not be discussed in detail here. Prior to read/write BIST testing, the redundancy latches are loaded with 0s to disable steering. During read/write BIST testing, failing read address data is stored in a register in the BIST. The match-line operations are then tested with test results stored in the match-line 16 latches shown in FIG. 1 and 'expect match/missmatch' data stored in the BIST compare latches 17 also shown in FIG. 1. The two sets of latches are compared by the XNOR 34 circuitry shown in FIG. 3 to determine if a match-line fail has occurred. This comparison data is stored in the pass/fail "sticky" latches 35 shown in FIG. 3 and provides the match-line fail data. Sticky latches are well known in the art and therefore will not be discussed here. The architecture is structured so that the match-line fail data contained in the sticky latches can be accessed using only one shift operation which is done just before the end of BIST testing in order to capture the match-line fail address in a register in the BIST. This technique is much more efficient compared to scanning fail data after each test pattern compare.

At this point, both read/write failing word-line addresses and match-line failing addresses are stored in registers in the BIST. These registers will contain an enable bit to indicate a failing address in the case of a failing word-line or match-line. In addition, if blocks of word-line are replaced instead of single lines, some of the LSBs (Least Significant Bit) of the failing address can be ignored (i.e. by replacing 4 word-lines at once, the last 2 LSBs of a failing address can be ignored because 4 word-lines would be replaced). At the end of BIST, a comparison of these two registers is done to determine if the failing word-line addresses are the same as the failing match-line addresses, and as such, whether the design is "fixable". If the compare is valid, then a "fixable" latch in the BIST is set to indicate that the design is reparable. The number of failing addresses stored and compared is, of course, dependent upon the number of redundant word-line groups available in the design. If redundancy is possible, the redundancy pattern generated by the comparison operation is stored (i.e. fuses) and loaded upon initialization into the redundancy latches so that steering is enabled.

While the invention has been described in terms of a single preferred embodiment, those skilled in the art will recognize that the invention can be practiced with modification within the spirit and scope of the appended claims.

We claim:

1. A content-addressable memory (CAM) system, comprising:
   a content addressable memory (CAM) array adapted to store data;
   a redundant CAM array adapted to store data, said redundant CAM array being redundant entries in said CAM array;
   a redundancy circuit adapted to steer word-lines and match-lines in a complementary manner to redirect input-output signals connected to said redundant CAM array from said CAM array, said complementary manner of said steering circuit steering word-lines and match-lines so that word-line and match-line outputs coincide.

2. The memory system of claim 1 wherein the redundancy circuit comprises:
   redundancy latches adapted to store steering information;
   word-line drivers coupled to word-lines of said CAM array and said redundant CAM array;
   word-line redundancy MUXs adapted to enable and disable said word-line drivers based on said steering information;
   match-line redundancy MUXs adapted to alter match-lines signal connections based on said steering information.

3. A content addressable memory system of claim 1 wherein a BIST (Built-in-Self-Test) is used for checking and comparing existing errors.

4. The memory system of claim 1 wherein a single failed word-line could be replaced by a redundant word-line.

5. The memory system of claim 1 wherein a block of n word-lines can be replaced by a block of n redundant word-lines with a replacement selection granularity of m.

6. A method of redundancy of word-lines in a content-addressable memory (CAM) having the ability to store the redundancy repair data pattern in redundant word-lines in said CAM, comprising the step of testing read/write operation on word-lines by using a BIST (built-in self-test) and storing failing word-line address locations, wherein word-lines and match-lines are steered so that match-lines remain coincident with word-lines.

7. The method of claim 6 further comprising the step of testing match-lines by using the BIST.

8. The method of claim 6 further comprising the step of storing the failing match line data.

9. The method of claim 6 further comprising the step of comparing read/write fail data with match-line fail data to determine if redundancy is possible.

10. The method of claim 6 further comprising the step of the redundancy repair data pattern.

11. The method of claim 6 further comprising the step of the loading of stored redundancy repair data pattern upon initialization so the redundancy steering is activated.

* * * * *